(12) United States Patent
Agrawal et al.

(10) Patent No.: US 6,864,713 B1
(45) Date of Patent: *Mar. 8, 2005

(54) MULTI-STAGE INTERCONNECT ARCHITECTURE FOR COMPLEX PROGRAMMABLE LOGIC DEVICES

(75) Inventors: Om P. Agrawal, Los Altos, CA (US); Paul R. Bonwick, Corsham (GB)

(73) Assignee: Lattice Semiconductor Corporation, Hillsboro, OR (US)

( * ) Notice: Subject to any disclaimer, the term of this patent is extended or adjusted under 35 U.S.C. 154(b) by 13 days.

This patent is subject to a terminal disclaimer.

(21) Appl. No.: 10/428,888

(22) Filed: May 1, 2003

(51) Int. Cl.⁷ .......................................... H03K 19/177
(52) U.S. Cl. .............................. 326/41; 326/40; 326/39
(58) Field of Search ............................. 326/41, 40, 39, 326/42, 38

(56) References Cited

U.S. PATENT DOCUMENTS

| | | | | |
|---|---|---|---|---|
| 5,966,027 A | * | 10/1999 | Kapusta et al. | 326/41 |
| 6,100,714 A | * | 8/2000 | Xiao et al. | 326/41 |
| 6,184,713 B1 | | 2/2001 | Agrawal et al. | |
| 6,259,273 B1 | * | 7/2001 | Yin et al. | 326/41 |
| 6,348,813 B1 | * | 2/2002 | Agrawal et al. | 326/41 |

OTHER PUBLICATIONS ispMACH 5000VG Family, 3.3V In–System Programmable SuperBIG, SuperWIDE High Density PLDs Datasheet, Lattice Semiconductor Corporation, Dec. 2001.

ispXPLD 5000MX Family, 3.3V, 2.5V and 1.8V In–System Programmable eXpanded Programmable Logic Device XPLD Family Datasheet, Lattice Semiconductor Corporation, Mar. 2003.

U.S. patent application entitled "Programmable Logic Device With Enhanced Wide And Deep Logic Capability", give Appl. No. 10/428,982, filed on May 1, 2003.

U.S. patent application entitled "CPLD with Multi–Function Blocks And distributed Memory", given Appl. No. 10/428, 889, filed on May 1, 2003.

U.S. patent application entitled "Cascaded Logic Block Architecture For Complex Programmable Logic Devices ", given Appl. No. 10/428,885, filed on May 1, 2003.

ispMACH 4000V/B/C/Z Family Data Sheet, Lattice Semiconductor Corporation, 2003, pp. 1–82 Mar. 2003.

* cited by examiner

*Primary Examiner*—Michael Tokar
*Assistant Examiner*—Lam T. Mai
(74) *Attorney, Agent, or Firm*—MacPherson Kwok Chen & Heid LLP; Greg J. Michelson

(57) ABSTRACT

Systems and methods are disclosed for providing a multi-stage interconnect architecture, such as for high density and high performance complex programmable logic devices. As an example, a first stage of a two-stage interconnect architecture programmably routes signals from a global routing structure to a second stage of the two-stage interconnect architecture. The second stage routes signals from the first stage to a number of logic blocks. The second stage also-optionally routes feedback signals from the logic blocks along with signals from associated I/O terminals back to the logic blocks to provide local feedback capability.

21 Claims, 4 Drawing Sheets

MULTI-STAGE INTERCONNECT ARCHITECTURE FOR COMPLEX PROGRAMMABLE LOGIC DEVICES

TECHNICAL FIELD

The present invention relates generally to electrical circuits and, more particularly, to an interconnect architecture, for integrated circuits and especially for complex programmable logic devices.

BACKGROUND

Programmable logic devices, such as a complex programmable logic device, are well known and are employed in numerous types of applications. One example of such a device is shown and described in U.S. Pat. No. 6,184,713, which is incorporated herein by reference in its entirety.

A complex programmable logic device (CPLD) typically includes a number of independent logic blocks interconnected by a global or centralized routing structure. For example, FIG. 1 illustrates a block diagram of a conventional CPLD that includes a routing structure 100 and logic blocks 102 (sixteen independent logic blocks 102), with each logic block 102 having 16 macrocells and receiving 36 inputs from routing structure 100. The architecture of the logic block and of the routing structure (or interconnect) are two significant factors that determine the density, performance, and scalability of a COLD.

As an example, a logic block architecture may include a programmable AND array to assist in providing AND-OR product term based logic (sum of products). The AND array generally has a large number of fuses, such as for example 2(N)(M)(P) fuses, where "N" is the number of inputs to the logic block, "M" is the number of macrocells in the logic block, and "P" is the average number of product terms per macrocell. One drawback of this logic block architecture is that the number of fuses generally required (i.e., array fuse density or array fuse count) increases rapidly for higher density CPLDs with wide input logic blocks.

For example, a logic block in a low density CPLD may have 36 inputs, 16 macrocells, and 5 product terms per macrocell, which results in approximately 5,760 fuses (i.e., 2(36)(16)(5) 5,760 based on the formula given above) in the AND array. As another example, a logic block in a high density CPLD may have 68 inputs, 32 macrocells, and 5 product terms per macrocell, which results in approximately 21,760 fuses (i.e., 2(6.8)(32)(5)=21,760). Note that there may also be additional product terms such as for example control or clock functions. Consequently for these two specific examples, the high density CPLD offers twice the macrocell density but at a cost of almost four times the number of fuses in the AND array, which consumes valuable circuit area of the CPLD. Thus, smaller logic blocks tend to be more area efficient in terms of the number of fuses that are required for the AND array.

As noted above, a CPLD routing structure architecture typically includes a centralized or global routing structure, which attempts to emulate to some extent a full cross-point switch to route various signals (e.g., macrocell feedback signals, input/output (I/O) feedback signals, or dedicated input signals) to appropriate logic blocks within the CPLD. As an example, a typical CPLD utilizes a multiplexer-based routing scheme to maximize speed while minimizing signal blocking (i.e., maximize routing capability). Each logic block generally receives all of its inputs from the routing structure via an associated, independent, and separate single-level multiplexer-based structure.

An interconnect fuse density associated with this routing structure is affected by the number of inputs to the logic block and the associated multiplexer structure. Generally, logic blocks having more inputs tend to be more interconnect efficient in terms of circuit area than logic blocks having fewer inputs, because there can be relatively fewer multiplexers and fewer interconnect fuses.

Because of the limitations noted above, CPLDs having small logic blocks (e.g., logic blocks with narrow inputs, such as for, example 36 inputs that are typically associated with low density devices) are difficult to scale to higher densities, because of the poor interconnect efficiency (e.g., high interconnect fuse density) associated with the smaller logic blocks. On the other hand, CPLDs having large logic blocks (e.g., logic blocks with wide inputs, such as for example 68 inputs that are typically associated with high density devices) are difficult to scale to higher densities, because of the poor array efficiency (e.g., high array fuse density) associated with the larger logic blocks. As a result, there is a need for an improved CPLD architecture that may provide the array efficiency associated with small logic block architectures and the interconnect efficiency associated with large logic block architectures.

SUMMARY

Systems and methods are disclosed herein to provide an improved PLD architecture. For example in accordance with an embodiment of the present invention, a two stage interconnect architecture with local feedback is disclosed for a CPLD that is scalable for high density and high performance applications. The two stage interconnect architecture retains some of the array efficiencies associated with a small logic block and some of the interconnect efficiencies of a larger logic block, while providing a high performance interconnect architecture.

More specifically, in accordance with one embodiment of the, present invention, a programmable logic device includes a routing structure adapted to route signals within the programmable logic device; a plurality of logic blocks arranged into a plurality of clusters, with each cluster having at least two of the logic blocks; and a plurality of multi-stage interconnects adapted to route signals from the routing structure to the plurality of logic blocks within the plurality of clusters, with each of the multi-stage interconnects corresponding to one of the clusters.

In accordance with another embodiment of the present invention, a two-stage interconnect of a programmable logic device includes a first switch matrix adapted to programmably select from a plurality of input signals and provide a first set of output signals; and a plurality of second switch matrices adapted to programmably select from the first set of output signals and provide a second set of output signals to a corresponding plurality of logic blocks.

In accordance with another embodiment of the present invention, a method of routing signals to logic blocks that are arranged in groups within a programmable logic device includes selecting from a global routing structure having a plurality of signals a first set of signals for each of the groups; providing a feedback path for feedback signals from the logic blocks, wherein the feedback path bypasses the global routing structure; and selecting from the first set of signals and the feedback signals a second set of signals for each of the logic blocks within each of the groups.

The scope of the invention is defined by the claims, which are incorporated into this section by reference. A more complete understanding of embodiments of the present

BRIEF DESCRIPTION OF THE DRAWINGS

The preferred embodiments of the present invention and their advantages are best understood by referring to the detailed description that follows. It should be appreciated that like reference numerals are used to identify like elements illustrated in one or more of the figures.

DETAILED DESCRIPTION

Systems and methods are disclosed for providing a multi-stage interconnect from a routing structure (e.g., a global routing structure, which may run centrally and could have multiple routing levels) to logic blocks within a programmable logic device (e.g., a CPLD). As an example, a two-stage interconnect, depending upon the application (e.g., the number of logic blocks and the number of inputs that each receives), may provide efficiencies in terms of the number of array fuses and/or interconnect fuses relative to a conventional interconnect architecture. These efficiencies may allow greater scalability to higher density devices. Furthermore, interconnect performance may be improved by providing a local feedback path for a logic block that bypasses the routing structure, as described further herein.

The two-stage interconnect also allows logic blocks to be arranged in clusters (also referred to as groups), such that for example, each logic block in the cluster (group) may be utilized as a separate logic block or cascaded with other logic blocks within its cluster such that they all serve to function as one relatively larger logic block (e.g., a large virtual logic block). The cluster-based logic blocks with the two-stage interconnect, for example, may provide further array fuse density efficiencies relative to a conventional large logic block and/or interconnect fuse density efficiencies relative to a conventional smaller logic block due to the optional virtual logic block nature of the cluster-based logic blocks and the signals being provided via the two-stage interconnect.

Figure 1:
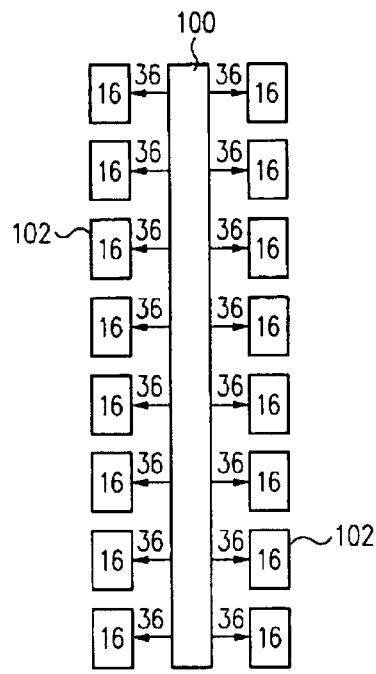
FIG. 1 shows a block diagram illustrating a conventional complex programmable logic device.
Figure 2A:
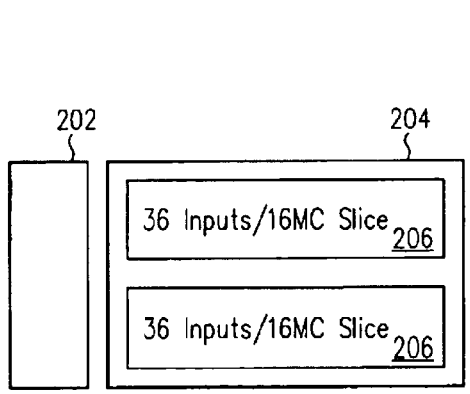
FIGS. 2a and 2b show block diagrams illustrating cluster-based logic blocks in accordance with an embodiment of the present invention.
Figure 2B:
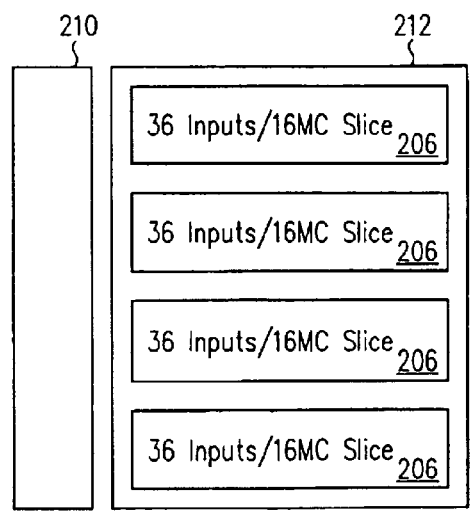

For example, FIGS. 2a and 2b show block diagrams illustrating exemplary cluster-based logic blocks in accordance with an embodiment of the present invention. Specifically, FIG. 2a includes a routing structure 202 and logic blocks 206, which form a cluster 204. Routing structure 202 provides a central global routing structure within the programmable logic device and also, in conjunction with a two-stage interconnect as discussed further herein, provides signals (e.g., data, programming, or control) to logic blocks 206.

As shown in an exemplary fashion, cluster 204 includes two of logic blocks 206, but this is not limiting and cluster 204 could include more than two logic blocks 206, such as for example three, four, or eight. For example, FIG. 2b illustrates a routing structure 210 (similar to that of routing structure 202 in FIG. 2a) serving a cluster 212 having four logic blocks 206.

Each logic block 206 may also be referred to herein as a slice or a logic slice that, for example, receives a number of inputs and includes a number of macrocells to provide a desired logical output. The number of inputs and the number of macrocells may be any number, depending upon the intended application, and is not limiting.

Logic blocks 206 may each function as separate logic blocks or combined within their cluster to function as a larger logic block. For example, each logic block 206 within cluster 204 may function as a 36 input, 16 macrocell logic block or each logic block 206 may be combined to function as one 72 input, 16 macrocell logic block. As an example, if each macrocell receives five product terms, then each logic block 206 receives 80 product terms that may be associated with the inputs, with cluster 204 having 80 product terms per logic block 206 or 160 product terms when logic blocks 206 are cascaded (i.e., combined together).

Similarly, each logic block 206 within cluster 212 may function as a 36 input, 16 macrocell logic block or logic blocks 206 may be combined to function as two 72 input, 16 macrocell logic blocks, one 108 input, 16 macrocell logic block and one 36 input, 16 macrocell logic block, or as one 144 input, 16 macrocell logic block. As another example and assuming five product terms per macrocell, cluster 212 may have 80 product terms per logic block 206 or 160, 240, or 320 product terms, with cluster 212 functioning as one virtual logic block when logic blocks 206 are all cascaded.

Thus, a variable cluster size may be designed or implemented, depending upon the application, to support variable width and depth of logic. Furthermore, various sized programmable logic devices may be derived from the same basic interconnect and logic block architecture with a range from low to high density due to the scalable nature, with the number of clusters and the number of logic blocks per cluster variable.

Figure 3:
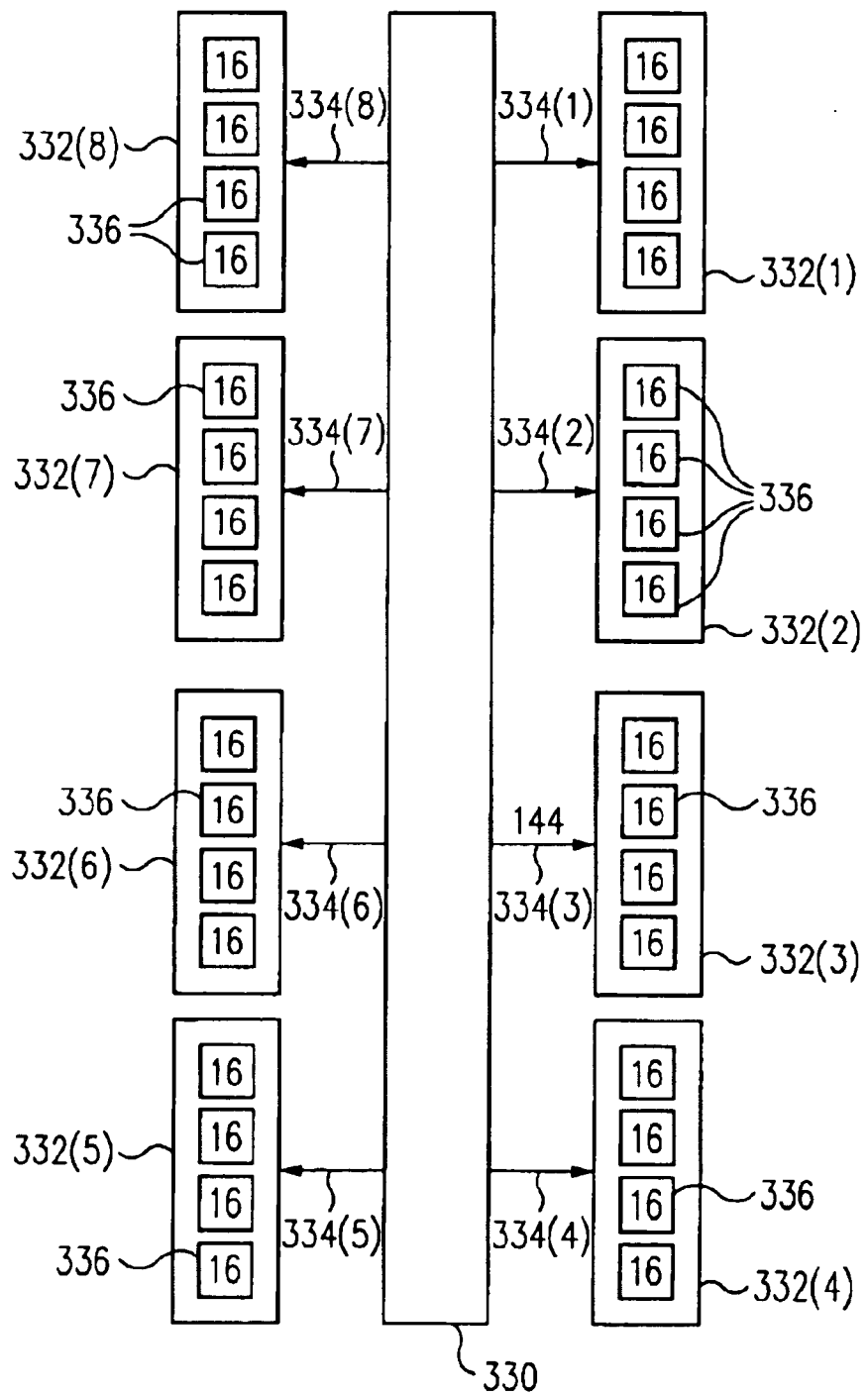
FIG. 3 shows a block diagram illustrating a number of cluster-based logic blocks in accordance with an embodiment of the present invention.

The architecture discussed in reference to FIGS. 2a and 2b may be applied to a device having multiple clusters. For example, FIG. 3 illustrates an architecture having a routing structure 330 and clusters 332 (which are separately referenced as 332(1), 332(2), . . . , through 332(8)). As shown, there are four logic blocks 336 per cluster 332, which can be cascaded as discussed herein (e.g., in reference to FIG. 2b). Logic blocks 336 may have 16 macrocells, as indicated in FIG. 3, or any number of macrocells, such as for example, 8 or 32. Furthermore, the number of inputs and associated product terms may be variable, as noted above, and are not limited to any number (e.g., there may be 144 inputs per cluster as indicated in FIG. 3, but this is merely an example and is not limiting).

As a specific example, FIG. 3 may represent a 512 macrocell device formed into eight clusters 332 of logic blocks 336. Each cluster 332 includes four 16 macrocell cascadable logic blocks 336, with each logic block 336 having 36 inputs and 83 product terms. Logic blocks 336 are cascadable in terms of their inputs and product terms. Further details regarding cascadable logic blocks may be found in U.S. patent application Ser. No. 10/428,885 entitled "Cascaded Logic Block Architecture For Complex Programmable Logic Devices" filed concurrently herewith, which is incorporated herein by reference in its entirety.

As an example, there are eight two-stage interconnects (not shown) that provide signals to each of the corresponding eight clusters 332 (i.e., one two-stage interconnect for each cluster). As shown in FIG. 3, signal paths 334(1) through 334(8) represent signal paths provided by the eight two-stage interconnects to corresponding clusters 332(1) through 332(8), respectively. As an example, a first stage of the two-stage interconnect may include a switch matrix (e.g., a partially populated switch matrix) that routes a number of signals from routing structure 330 and provides these signals to a second stage of the two-stage interconnect. The second stage may include a switch matrix (e.g., a partially or a fully populated switch matrix) that routes the signals received from the first stage, as well as optionally signals from associated macrocells and input/output (I/O) pin signals, to its associated logic blocks 336.

Figure 4:
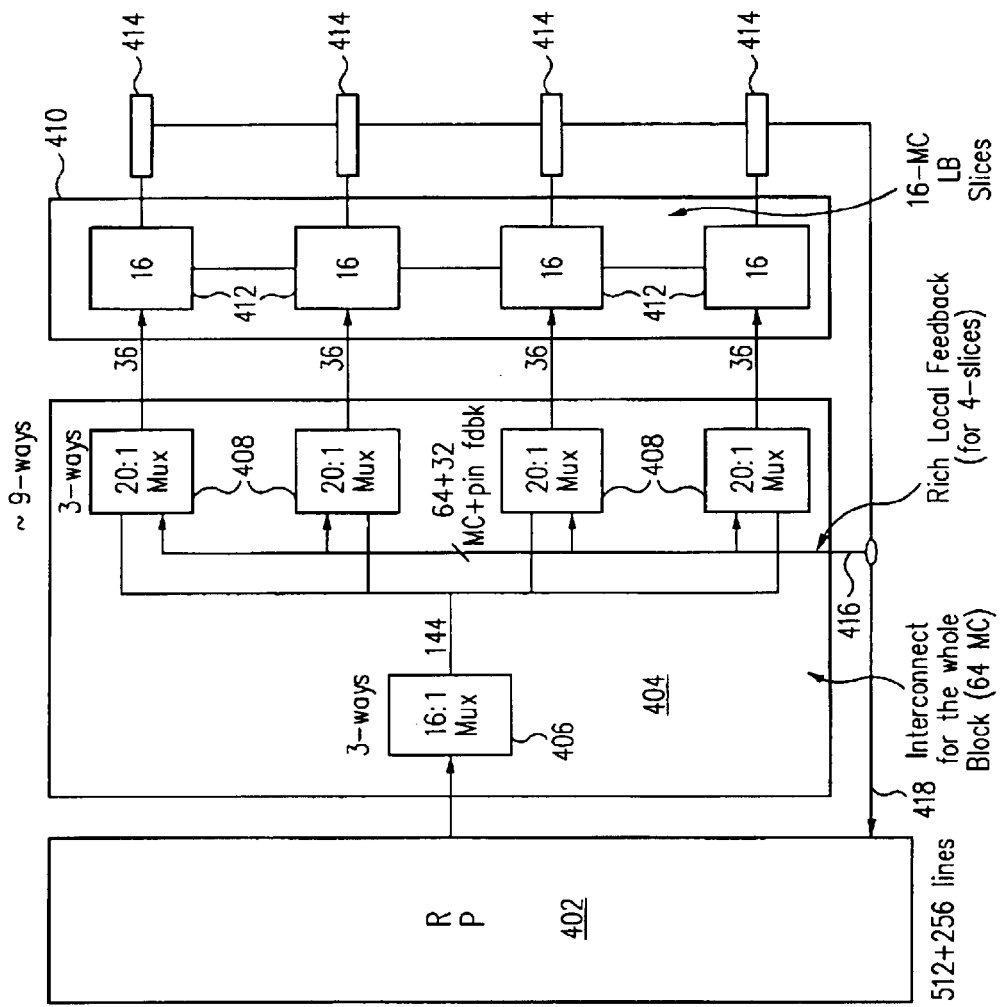
FIG. 4 shows an exemplary implementation of a two-stage interconnect for cluster-based logic blocks in accordance with an embodiment of the present invention.
Figure 5:
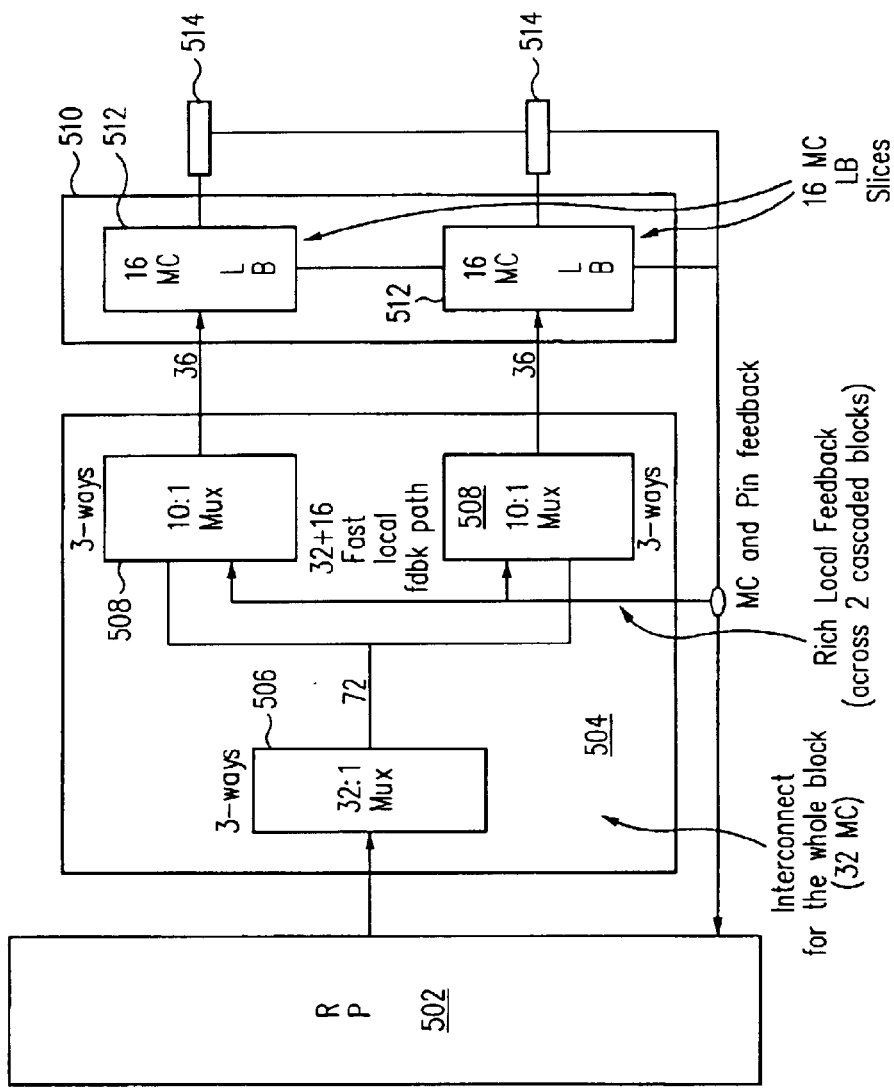
FIG. 5 shows another exemplary implementation of a two-stage interconnect for cluster-based logic blocks in accordance with an embodiment of the present invention.

FIGS. 4 and 5 show exemplary implementations of a two-stage interconnect structure for cluster-based logic blocks in accordance with an embodiment of the present invention. It should be understood that FIGS. 4 and 5 are exemplary implementations and that the number of signals for a given signal path as well as switch matrix ratios (e.g., 16:1 multiplexer or mux) and number of logic blocks and macrocells per logic block are not limiting and may be varied as a specific design, implementation, or application requires.

Specifically, FIG. 4 shows a routing structure 402, a two-stage interconnect 404, and a cluster 410. Routing structure 402 assists in routing signals to and from and/or within the programmable logic device. Two-stage interconnect 404 routes selected signals from routing structure 402 to cluster 410. In this exemplary implementation, cluster 410 has four logic blocks 412, with each having 16 macrocells and 36 inputs (as discussed similarly for cluster 212 and cluster 332 in FIGS. 2b and 3, respectively).

Two-stage interconnect 404 includes a first switch matrix 406 and a number of second switch matrices 408. For example, there may be one second switch matrix 408 for each corresponding logic block 412, with each second switch matrix 408 functioning as a local routing structure for its corresponding logic block 412. First switch matrix 406, which functions as a number of multiplexers, routes selected signals from routing structure 402 to second switch matrices 408.

For example, first switch matrix 406 may be a partially populated programmable switch matrix that selectively routes one signal from each of 144 groups of sixteen signal paths, from routing structure 402 having 768 signal paths (e.g., interconnect lines), to corresponding ones of 144 signal paths, which are routed to second switch matrices 408. For this example, first switch matrix 406 functions as 144 16:1 multiplexers, with each of the 768 signal paths being selectably routable through any of three multiplexers out of the 144 multiplexers. Thus, for this example, first switch matrix 406 provides three-way routability (i.e., 144 output signals with 16 choices per output signal from 768 input signals, or 16*144/768, which provides three different signal paths for each input signal) from routing structure 402 to second switch matrices 408.

It should be understood that three-way routability for first switch matrix 406 is exemplary and that the degree of routability may be varied, such as for example to provide two-way, 2.5-way, four-way, or five-way routability (or more). First switch matrix 406 may also be a fully populated switch matrix, but this would require a large number of fuses and utilize a large amount of integrated circuit area.

Second switch matrices 408 route signals received from first switch matrix 406 to logic blocks 412 within cluster 410. Second switch matrices 408 also may route signals from I/O terminals 414 (i.e., terminals, leads, pins, or other types of connectable points for providing I/O paths for the integrated circuit, which circuitry shown in FIG. 4 forms a part of) and/or signals from logic blocks 412 via leads 416 to one or more of logic blocks 412. Logic blocks 412 perform the desired logic function on the received signals and provide output signals which may be routed to I/O terminals 414, second switch matrices 408, and/or routing structure 402. The signals from I/O terminals 414 and logic blocks 412 may also be provided to routing structure 402 via leads 418.

As a specific example (illustrated in FIG. 4), first switch matrix 406 of two-stage interconnect 404 provides 144 signals from routing structure 402 to second switch matrices 408. Second switch matrices 408 of two-stage interconnect 404 provides 36 input signals to each logic block 412 within corresponding cluster 410. The 36 input signals may be selected from the 144 signals from first switch matrix 406, 64 local feedback signals from the 64 macrocells (i.e., 16 macrocells per logic block 412, with each macrocell providing a local feedback signal) within cluster 410, and 32 I/O signals from I/O pins 414 (i.e., assuming two macrocells share each I/O pin 414).

If logic blocks 412 are cascadable (i.e., from 36 to 72, 104, or 144 inputs), cluster 410 can function, for example, as a 144 input/16 macrocell logic block, a 108 input/16 macrocell logic block and a 36 input/16 macrocell logic block, two 72 input/16 macrocell logic blocks, or as four 6 input/16 macrocell logic blocks. Consequently, two-stage interconnect architecture may provide interconnect efficiencies that are typically associated with large logic blocks (e.g., a 144 input/16 macrocell logic block) while providing array efficiencies that are typically associated with small logic blocks (e.g., a 36 input/16 macrocell logic block).

Second switch matrices 408 are shown in FIG. 4 (e.g., a switch matrix representing 36 20:1 multiplexers per logic block 412) as providing an exemplary routability of approximately three-ways (i.e., 20*36/(144+64+32)=3). Second switch matrices 408 may also be a fully populated switch matrix, but this would require a large number of fuses and utilize a large amount of integrated circuit area. Therefore, for this specific example, two-stage interconnect 404 provides conceptually approximately nine-way routability (i.e., approximately three-way routability for first switch matrix 406 and conceptually for some signals three-way routability for second switch matrix 408 for a combined nine-way routability) for signals from routing structure 402 to each logic block 412.

FIG. 4 illustrates an exemplary two-stage interconnect architecture 404, in accordance with an embodiment of the present invention, that would be directly applicable for the architecture discussed in reference to FIG. 2b or 3 (i.e., four logic blocks 206 per cluster 212 or four logic blocks 336 per cluster 332, respectively). However, it should be understood that two-stage interconnect architecture 404 is not limiting and may be modified to support architectures having a different number of logic blocks (whether cascadable or not) for each two-stage interconnect within the logic device and possibly a different degree of routability.

In accordance with an embodiment of the present invention, the two stage interconnect architecture is scalable to high densities, as compared to conventional architectures, due to its available array efficiency (by minimizing the array fuse count by employing relatively small logic blocks) along with its available interconnect efficiency (by minimizing the interconnect fuse count by maintaining characteristics of larger logic blocks). The two stage interconnect architecture provides a high performance interconnect architecture that may include a local feedback path, which avoids delays associated with requiring all logic block inputs to be provided by a global routing structure.

Conventional higher density CPLDs tend to be slower relative to conventional lower density CPLDs due to the limitations or complexity of the interconnect structure and the lack of a fast, local feedback interconnect. In contrast, the two-stage interconnect architecture with local feedback allows logic blocks to have a fast, local feedback path and provides deterministic delays to support high performance, high density, scalable architectures. Furthermore, the logic blocks may optionally be cascadable to provide selectable width logic block input.

As noted above, FIG. 5 shows another exemplary implementation of a two-stage interconnect structure for a programmable logic device in accordance with an embodiment of the present invention. Specifically, FIG. 5 includes a routing structure 502 (labeled RP for routing pool), a two-stage interconnect 504, and a cluster 510 of two logic blocks 512. The architecture shown in FIG. 5, for example, would be directly applicable for the architecture discussed in reference to FIG. 2a (i.e., two logic blocks 206 per cluster 204).

Two-stage interconnect 504 includes a first switch matrix 506 and second switch matrices 508 (i.e., two local routing pools), which are partially populated switch matrices, but could also he fully populated switch matrices, as discussed above. First switch matrix 506 programmably selects a number of signals from routing structure 502 to provide to second switch matrices 508. Second switch matrices 508 receive the signals from first switch matrix 506 along with optionally local feedback signals from logic blocks 512 and I/O terminals 514 and programmably select from among these signals the ones to route to logic blocks 512.

As a specific example as shown in FIG. 5, routing structure 502 provides 768 interconnect lines from which first switch matrix 506 selects 72 whose signals are provided to second switch matrices 508. Second switch matrices 508 receives these 72 signals along with 16 signals from I/O terminals 514 and 32 signals from cluster 510 (i.e., one signal from each macrocell within logic blocks 512) and programmably provides, from among the 120 signals, 36 signals to provide to each logic block 512 (i.e., each logic block 512 receives 36 signals selected from routing structure 502 and macrocell and I/O signals). Thus, first switch matrix 506 (e.g., a switch matrix representing 72 32:1 multiplexers) provides three-way routability (i.e., 32*72/768=3) and second switch matrices 508 (e.g., a switch matrix representing 36 10:1 multiplexers per logic block 512) provides conceptually three-way routability (i.e., 10*36/120=3) for at least some of the signals. Furthermore, if logic blocks 512 are cascadable, cluster 510 can be viewed as a 72 input/16 macrocell logic block or as two 36 input/16 macrocell logic blocks.

The two-stage interconnect architecture discussed herein can be-applied to a cluster having two, three, four, five, or more logic blocks. The tradeoff may be in the fuse count for the first stage (e.g., first switch matrix 506) and the second stage (e.g., second switch matrices 508). As the number of logic blocks per cluster increases, a proportionally larger number of switch matrices (or local routing pools) in the second stage will be required (e.g., one switch matrix per logic block). For example, for each cluster there may be one first stage switch matrix and "M" second stage switch matrices, where "M" is the number of logic blocks per cluster.

As discussed in accordance with one or more embodiments of the present invention, a two-stage interconnect architecture is disclosed. The two-stage interconnect architecture may require significantly fewer fuses (array fuses and/or interconnect fuses) than conventional interconnect architectures. For example, the two-stage interconnect architecture may provide approximate array efficiencies associated with conventional smaller logic blocks (e.g., in terms of array fuse count) and provide interconnect efficiencies associated with conventional larger logic blocks (e.g., in terms of interconnect fuse count). For example, the fuse count savings associated with the first stage may be more than the additional fuses required by the second stage relative to conventional interconnect architectures.

The two-stage interconnect architecture also supports logic blocks that are grouped in clusters and that may be cascaded within a cluster so that the cluster functions as a large (virtual) logic block. The first stage routes the signals from the global routing structure (e.g., a one-tiered or multi-tiered routing pool) to the second stage of the two-stage interconnect, with the second stage, for example, functioning as a local routing pool for the logic blocks. The second stage provides high speed for local connectivity and intra-cluster direct and local feedback capability.

The local feedback helps to alleviate routing congestion of the global routing structure, because the feedback signals do not have to travel through the global routing structure as in conventional architectures. Thus, logic width cascading is provided to allow wider gating functions to be achieved without requiring feedback signals to traverse the global routing structure.

Embodiments described above illustrate but do not limit the invention. It should also be understood that numerous modifications and variations are possible in accordance with the principles of the present invention. For example, the principles of one or more embodiments of the present invention also apply to multi-stage interconnects having more than two stages and to PLDs other than CPLDs (e.g., field programmable gate arrays and programmable interconnect devices). Accordingly, the scope of the invention is defined only by the following claims.

We claim:

1. A programmable logic device comprising:
   a routing structure adapted to route signals within the programmable logic device;
   a plurality of logic blocks arranged into a plurality of clusters, with each cluster having at least two of the logic blocks; and
   a plurality of multi-stage interconnects adapted to route signals from the routing structure to the plurality of logic blocks within the plurality of clusters, with each of the multi-stage interconnects corresponding to one of the clusters.

2. The programmable logic device of claim 1, wherein each of the multi-stage interconnects comprises:
   a first stage having a partially populated switch matrix adapted to programmably select a first set of signals from the routing structure; and
   a second stage having a plurality of partially populated switch matrices, with each partially populated switch matrix in the second stage corresponding to one of the logic blocks in the corresponding cluster and adapted to programmably select from the first set of signals from the first stage a second set of signals for the corresponding logic block.

3. The programmable logic device of claim 2, wherein the plurality of partially populated switch matrices in the second stage are further adapted to receive feedback signals from the logic blocks in the corresponding cluster, the feedback signals bypassing the routing structure and the first stage.

4. The programmable logic device of claim 3, further comprising a plurality of input/output terminals couplable to the plurality of logic blocks, wherein the plurality of partially populated switch matrices in the second stage are further adapted to receive input/output signals from the input/output terminals, the input/output signals bypassing the routing structure and the first stage.

5. The programmable logic device of claim 3, wherein each of the logic blocks further comprises a plurality of macrocells.

6. The programmable logic device of claim 5, wherein the logic blocks within each of the clusters are cascadable.

7. The programmable logic device of claim 6, wherein the programmable logic device comprises a complex programmable logic device.

8. The programmable logic device of claim 6, wherein the logic blocks within each of the clusters are adapted to function as independent logic blocks or cascaded to function as a larger logic block.

9. The programmable logic device of claim 8, wherein the logic blocks within each of the clusters are adapted to be cascaded in terms of their input signals or their product terms.

10. The programmable logic device of claim 2, wherein the first stage and the second stage provides a reduced array fuse count relative to a conventional large logic block architecture and a reduced interconnect fuse count relative to a conventional small logic block architecture.

11. The programmable logic device of claim 2, wherein a fuse count savings associated with the first stage is greater than a fuse count required by the second stage, with a fuse count for the two-stage interconnect being less than would be required by conventional interconnect architectures.

12. A two-stage interconnect, of a programmable logic device, comprising:
   a first switch matrix adapted to programmably select from a plurality of input signals and provide a first set of output signals; and
   a plurality of second switch matrices adapted to programmably select from the first set of output signals and provide a second set of output signals to a corresponding plurality of logic blocks.

13. The two-stage interconnect of claim 12, wherein the first switch matrix and the second switch matrices are partially populated switch matrices.

14. The two-stage interconnect of claim 13, wherein the plurality of second switch matrices are further adapted to programmably select from feedback signals from the plurality of logic blocks to provide as part of the second set of output signals, the feedback signals bypassing the first switch matrix.

15. The two-stage interconnect of claim 14, wherein the plurality of second switch matrices are further adapted to programmably select from input/output signals from input/output terminals to provide as part of the second set of output signals, the input/output signals bypassing the first switch matrix.

16. The two-stage interconnect of claim 12, wherein the plurality of input signals are programmably selected from a global routing structure within a complex programmable logic device.

17. The two-stage interconnect of claim 16, wherein the two-stage interconnect is replicated to form a plurality of two-stage interconnects corresponding to a plurality of clusters of the logic blocks.

18. A method of routing signals to logic blocks that are arranged in groups within a programmable logic device, the method comprising:
   selecting from a global routing structure having a plurality of signals a first set of signals for each of the groups;
   providing a feedback path for feedback signals from the logic blocks, wherein the feedback path bypasses the global routing structure; and
   selecting from the first set of signals and the feedback signals a second set of signals for each of the logic blocks within each of the groups.

19. The method of claim 18, further comprising providing a signal path for input/output signals from input/output terminals, wherein the second set of signals is further selected from the input/output signals.

20. The method of claim 19, wherein the logic blocks are cascadable.

21. The method of claim 19, wherein the feedback signals are provided by macrocells within the logic blocks.

* * * * *